United States Patent
Kamal et al.

(10) Patent No.: US 11,687,147 B1
(45) Date of Patent: Jun. 27, 2023

(54) REDUCING LEAKAGE POWER IN LOW-POWER MODE OF AN INTEGRATED CIRCUIT DEVICE

(71) Applicant: Marvell Asia Pte, Ltd., Singapore (SG)

(72) Inventors: Kushal Kamal, Bangalore (IN); Sreekanth G. Pai, Cochin (IN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/447,969

(22) Filed: Sep. 17, 2021

Related U.S. Application Data (60) Provisional application No. 63/080,416, filed on Sep. 18, 2020.

(51) Int. Cl.
| | |
|---|---|
| G06F 1/00 | (2006.01) |
| G06F 1/3296 | (2019.01) |
| H03K 19/20 | (2006.01) |
| G01R 31/3181 | (2006.01) |
| G06F 1/30 | (2006.01) |
| G11C 7/10 | (2006.01) |

(52) U.S. Cl.
CPC ....... *G06F 1/3296* (2013.01); *G01R 31/3181* (2013.01); *G06F 1/30* (2013.01); *H03K 19/20* (2013.01); *G11C 7/1096* (2013.01)

(58) Field of Classification Search
CPC ...... G06F 1/3296; G06F 1/30; G01R 31/3181
See application file for complete search history.

(56) References Cited

U.S. PATENT DOCUMENTS

| | | | | |
|---|---|---|---|---|
| 2013/0139013 | A1* | 5/2013 | Jain ................ | G01R 31/318555 |
| | | | | 714/E11.155 |
| 2013/0262944 | A1* | 10/2013 | Hossain ............. | G01R 31/3177 |
| | | | | 714/727 |
| 2017/0068772 | A1* | 3/2017 | Nagaraj ................... | H03K 5/13 |
| 2017/0192711 | A1* | 7/2017 | Muralimanohar .... | G06F 3/0638 |
| 2019/0229720 | A1* | 7/2019 | Bakalski .............. | H03K 17/102 |
| 2022/0120809 | A1* | 4/2022 | Porst ................... | G01R 31/3177 |

* cited by examiner

*Primary Examiner* — Mohammed H Rehman (57) ABSTRACT

An integrated circuit device includes a plurality of cells or modules. Each respective one of the cells or modules consumes leakage power, and the amount of leakage power consumed by a respective one of the cells or modules varies depending on states of its inputs. Scan-chain circuitry is configured to propagate through the integrated circuit device, on entry of the integrated circuit device to a low-power mode, a scan-chain pattern created in advance, to apply, to each respective cell or module in the low-power mode, a set of inputs that results in a respective low-power state with reduced leakage power. Creating the scan chain pattern includes identifying respective ones of the cells or modules as having the highest leakage power consumption, and a respective combination of inputs to place each of those the cells or modules in a respective low-power state.

18 Claims, 5 Drawing Sheets

REDUCING LEAKAGE POWER IN LOW-POWER MODE OF AN INTEGRATED CIRCUIT DEVICE

CROSS REFERENCE TO RELATED APPLICATIONS

This disclosure claims the benefit of copending, commonly-assigned U.S. Provisional Patent Application No. 63/080,416, filed Sep. 18, 2020, which is hereby incorporated by reference herein in its entirety.

FIELD OF USE

This disclosure relates to reducing or minimizing leakage power in a low-power mode of an integrated circuit device. More particularly, this disclosure relates to using available scan chain resources of an integrated circuit device to configure a low-power mode to reduce leakage power.

BACKGROUND

The background description provided herein is for the purpose of generally presenting the context of the disclosure. Work of the inventors hereof, to the extent that that work is described in this background section, as well as aspects of the description that may not otherwise qualify as prior art at the time of filing, are neither expressly nor impliedly admitted to be prior art against the subject matter of the present disclosure.

Large integrated circuit devices—whether they are large individual dice or systems-on-chip including multiple dice—may include many individual circuit cells or modules, not all of which are active at any one time. In certain situations, an integrated circuit device may be operating in a mode in which certain of those cells or modules will not be used, and if that mode will last long enough, it may be worthwhile, from a power consumption perspective, to place those cells or modules into a low-power mode. One technique used to implement a low-power mode is clock gating in which the clock inputs to cells or modules that are not being used are disabled, so that signals no longer propagate within such cells or modules. However, those cells or modules may continue to consume leakage power, and the amount of leakage power consumed by each cell or module may vary depending on the state of the inputs to the cell or module.

SUMMARY

A method according to implementations of the subject matter of this disclosure, for operating an integrated circuit device in a low-power mode to reduce leakage power in cells or modules of the integrated circuit device when respective ones of the cells or modules of the integrated circuit device are placed in respective low-power states, includes creating in advance at least one scan-chain pattern to apply, to each respective cell or module in the low-power mode, a set of inputs that results in a respective low-power state with reduced leakage power, and upon entry of the integrated circuit device into the low-power mode, propagating the scan-chain pattern through the integrated circuit device.

In a first implementation of such a method, creating in advance at least one scan-chain pattern may include identifying which respective ones of the cells or modules have highest leakage power consumption, for each respective one of the cells or modules identified as having the highest leakage power consumption, identifying a respective combination of inputs to place that respective one of the cells or modules in a respective low-power state to minimize leakage power consumption, and configuring the at least one scan-chain pattern to apply, to each respective one of the cells or modules identified as having the highest leakage power consumption, the respective combination of inputs to place that respective one of the cells or modules in a respective low-power state to minimize leakage power consumption.

In a second implementation of such a method, creating in advance at least one scan-chain pattern may include creating in advance a plurality of scan-chain patterns, each respective scan-chain pattern corresponding to a different respective low-power mode in which different ones of the cells or modules are placed into their respective low-power states. That implementation of the method further includes, upon entry of the integrated circuit device into the low-power mode, prior to propagating the scan-chain pattern through the integrated circuit device, identifying which respective low-power mode has been entered and selecting one of the plurality of scan-chain patterns corresponding to the respective low-power mode.

A third implementation of such a method may further include storing the at least one scan chain in a scan-chain memory, and on entry into the low-power mode, selecting the scan-chain memory as an input to scan-chain circuitry of the integrated circuit device.

A fourth implementation of such a method may further include, upon entry of the integrated circuit device into the low-power mode, prior to propagating the scan-chain pattern through the integrated circuit device, saving, for later use, data previously stored in scan-chain circuitry of the integrated circuit device.

A first aspect of that fourth implementation may further include, upon exit from the low-power mode, restoring the saved data to the scan-chain circuitry.

In a first instance of that first aspect, saving the data previously stored in the scan-chain circuitry of the integrated circuit device may include writing the data previously stored in the scan-chain circuitry of the integrated circuit device into a resume memory.

In a first variant of that first instance, restoring the saved data to the scan-chain circuitry may include writing the data in the resume memory into the scan-chain circuitry.

In a second variant of that first instance, writing the data in the resume memory into the scan-chain circuitry may include issuing a resume signal that selects output of the resume memory as input to the scan chain circuitry.

In a third variant of that first instance, writing the data previously stored in the scan-chain circuitry of the integrated circuit device into the resume memory may include, after a delay, from entry into the low-power mode, sufficient for low-power mode settings to settle, issuing a memory write signal to the resume memory.

An integrated circuit device according to implementations of the subject matter of this disclosure includes a plurality of cells or modules, each respective one of the cells or modules consuming leakage power, the amount of leakage power consumed by a respective one of the cells or modules varying depending on states of inputs to the respective one of the cells or modules, scan-chain circuitry configured to propagate through the integrated circuit device, on entry of the integrated circuit device to a low-power mode, a scan-chain pattern created in advance, to apply, to each respective cell or module in the low-power mode, a set of inputs that results in a respective low-power state with reduced leakage power.

In a first implementation of such an integrated circuit device, the scan-chain circuitry may be configured by creating in advance at least one scan-chain pattern by identifying which respective ones of the cells or modules have highest leakage power consumption, for each respective one of the cells or modules identified as having the highest leakage power consumption, identifying a respective combination of inputs to place that respective one of the cells or modules in a respective low-power state to minimize leakage power consumption, and configuring the at least one scan-chain pattern to apply, to each respective one of the cells or modules identified as having the highest leakage power consumption, the respective combination of inputs to place that respective one of the cells or modules in a respective low-power state to minimize leakage power consumption.

In a second implementation of such an integrated circuit device, the scan-chain circuitry may be configured to propagate through the integrated circuit device, on entry of the integrated circuit device to a low-power mode, one of a plurality of scan-chain patterns created in advance, each respective scan-chain pattern corresponding to a different respective low-power mode in which different ones of the cells or modules are placed into their respective low-power states. In that implementation, the scan-chain circuitry may include a controller configured to, upon entry of the integrated circuit device into the low-power mode, prior to propagating the scan-chain pattern through the integrated circuit device, identify which respective low-power mode has been entered and select one of the plurality of scan-chain patterns corresponding to the respective low-power mode.

A third implementation of such an integrated circuit device may further include a scan-chain memory configured to store the at least one scan chain, and a controller configured to, on entry into the low-power mode, select the scan-chain memory as an input to scan-chain circuitry of the integrated circuit device.

In a fourth implementation of such an integrated circuit device, the controller may be further configured to, upon entry of the integrated circuit device into the low-power mode, prior to propagating the scan-chain pattern through the integrated circuit device, save, for later use, data previously stored in scan-chain circuitry of the integrated circuit device.

According to a first aspect of that fourth implementation, the controller may be further configured to, upon exit from the low-power mode, restore the saved data to the scan-chain circuitry.

A first instance of that first aspect may further include a resume memory, and the controller may be further configured to write the data previously stored in the scan-chain circuitry of the integrated circuit device into the resume memory.

In a first variant of that first aspect, the controller may be configured to restore the saved data to the scan-chain circuitry by writing the data in the resume memory into the scan-chain circuitry.

In a second variant of that first aspect, the controller may be configured to write the data in the resume memory into the scan-chain circuitry by issuing a resume signal that selects output of the resume memory as input to the scan chain circuitry.

In a third variant of that first aspect, the controller may be configured to write the data previously stored in the scan-chain circuitry of the integrated circuit device into the resume memory by issuing a memory write signal to the resume memory after a delay, from entry into the low-power mode, sufficient for low-power mode settings to settle.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

When circuit modules on an integrated circuit device are placed into a low-power mode using clock gating, those modules may continue to consume leakage power and therefore the inputs of certain modules are adjusted so that the leakage power is minimized. This is particularly the case in modules incorporating transistors with low threshold voltages, and whose pull-up and pull-down paths are asymmetrical (e.g., in a NAND gate the pull-up path may include two transistors in parallel, while the pull-down path includes two transistors in series), which could result in substantially different levels of power consumption for different input states.

For example, in the case of a two-input NAND gate, the amount of power consumed may be different for each of the four possible input states (00, 01, 10, 11). In one example, power consumption may be lowest in the 00 state, and power consumption in the 11 state may be several times the power consumption in the 00 state, with the multiple in some cases being larger at higher temperatures.

As mentioned, the cells or modules of interest are those with high leakage power that also have low threshold voltages ($v_t$) and asymmetric pull-up and pull-down paths. Common types of structures that meet those criteria are AND-gates, NAND-gates, OR-gates, NOR-gates, AOI-gates (AND/OR/INVERT) and OAI-gates (OR/AND/INVERT). However, other structures may also exhibit high leakage power, low threshold voltages ($v_t$), and asymmetric pull-up and pull-down paths, or may otherwise be candidates for adjustment of their input states during clock gating, in accordance with implementations of the subject matter of this disclosure.

In accordance with implementations of the subject matter of this disclosure, a list or catalog may be compiled identifying the leakage power consumption of each input state for each type of cell or module that may be encountered in integrated circuit devices that are manufactured on a particular process node. Then, when a particular integrated circuit device is designed, the leakage power consumption of all cells or modules in that device may be identified and ranked from highest leakage power consumption to lowest leakage power consumption (or vice-versa). Next, particular modes of the integrated circuit device may be identified, and for each such mode the cells or modules to be placed in low-power operation when the device is in that mode may be listed in order of leakage power consumption, along with the input state for each cell or module that results in the lowest leakage power consumption.

At device run-time, when one of the identified low-power modes is to be entered, the cells or modules that are to be placed in a low-power state are determined from the aforementioned list. The cells or modules with the highest leakage power consumption are identified, and inputs to those cells or modules are configured to the state that results in the lowest leakage power consumption for those cells or modules. Because those inputs may be shared by other cells or modules, it may not be possible to place every cell or module into the lowest leakage power condition. Indeed, some cells or modules may be in a higher leakage power condition. However, the cells or modules with the highest maximum leakage power consumption are placed into their respective lowest leakage power states, while the cells that are placed into higher leakage power states are generally those cells or modules with lower maximum leakage power consumption. Therefore, the overall effect of the configuration of all cells or modules is to reduce total leakage power consumption. In some implementations, the maximum possible overall leakage power reduction may be achieved.

Adding circuitry to integrated circuit devices to control the inputs states of cells or modules to be placed in low-power mode may negate part or all of the power savings achieved by the low-power mode. Therefore, in accordance with implementations of the subject matter of this disclosure, the scan-chain infrastructure of the integrated circuit device, normally used only for configuration and testing at the time of manufacture, and not afterwards, is reused to configure the cells or modules to reduce leakage power consumption during clock gating mode.

Because the scan-chain infrastructure reaches all parts of the device, the scan-chain infrastructure can be used to deliver appropriate values to particular inputs of particular cells or modules to configure those cells or modules for minimum leakage power consumption. In implementations of the subject matter of this disclosure, minimal circuitry may be added to the scan-chain infrastructure to allow the scan-chain infrastructure to be activated at run-time, to store scan-chain patterns to configure various cells or modules, and to resume normal operations after exiting the low-power mode, as described below.

In accordance with implementations of the subject matter of this disclosure, the selection of which cells or modules to place in clock gating mode is dynamic—i.e., the selection is made by a system controller in real time based on current conditions. However, there may be only one fixed scan chain path or one set of fixed scan chain paths in the device, and the scan chain data for clock gating mode is stored in advance.

Therefore, in some implementations, a single set of scan chain data is compiled to adjust the inputs of the cells or modules with the highest leakage power consumption. Even though not all of those cells or modules may be in placed in clock gating mode, probabilistically, enough of them will be in clock gating mode that an overall reduction in leakage power will be achieved.

Alternatively, in other implementations, respective combinations of cells or modules that might need to be placed into clock gating mode under various conditions can be identified in advance, and a respective set of scan chain data can be compiled in advance to adjust the inputs of each one of those cells or modules in the respective combination that have the highest leakage power consumption, so that each of those cells or modules is placed into its respective lowest leakage power state among all of its possible leakage power states. When during run-time an actual combination of cells or modules is placed into clock gating mode, that one of the respective previously-compiled sets of scan chain data that best matches the actual conditions is selected and loaded to achieve the best reduction of leakage power consumption.

The contents of the scan chain data are loaded into registers or flip-flops in order that causes them, when read out through the scan chain, to propagate to the cell inputs whose values are to be set. However, those registers or flip-flops may have other uses during run-time and therefore may contain data when the scan chain is activated in accordance with implementations of the subject matter of this disclosure. Therefore, in some implementations, a resume mode is supported by, before loading the scan chain data into the registers or flip-flops, storing the then-current run-time contents of those registers or flip-flops to a resume memory. After exiting clock gating mode, the previous run-time state may be resumed by writing the contents of the resume memory back to the appropriate registers or flip-flops.

The subject matter of this disclosure may be better understood by reference to FIGS. 1-7.

Figure 1:
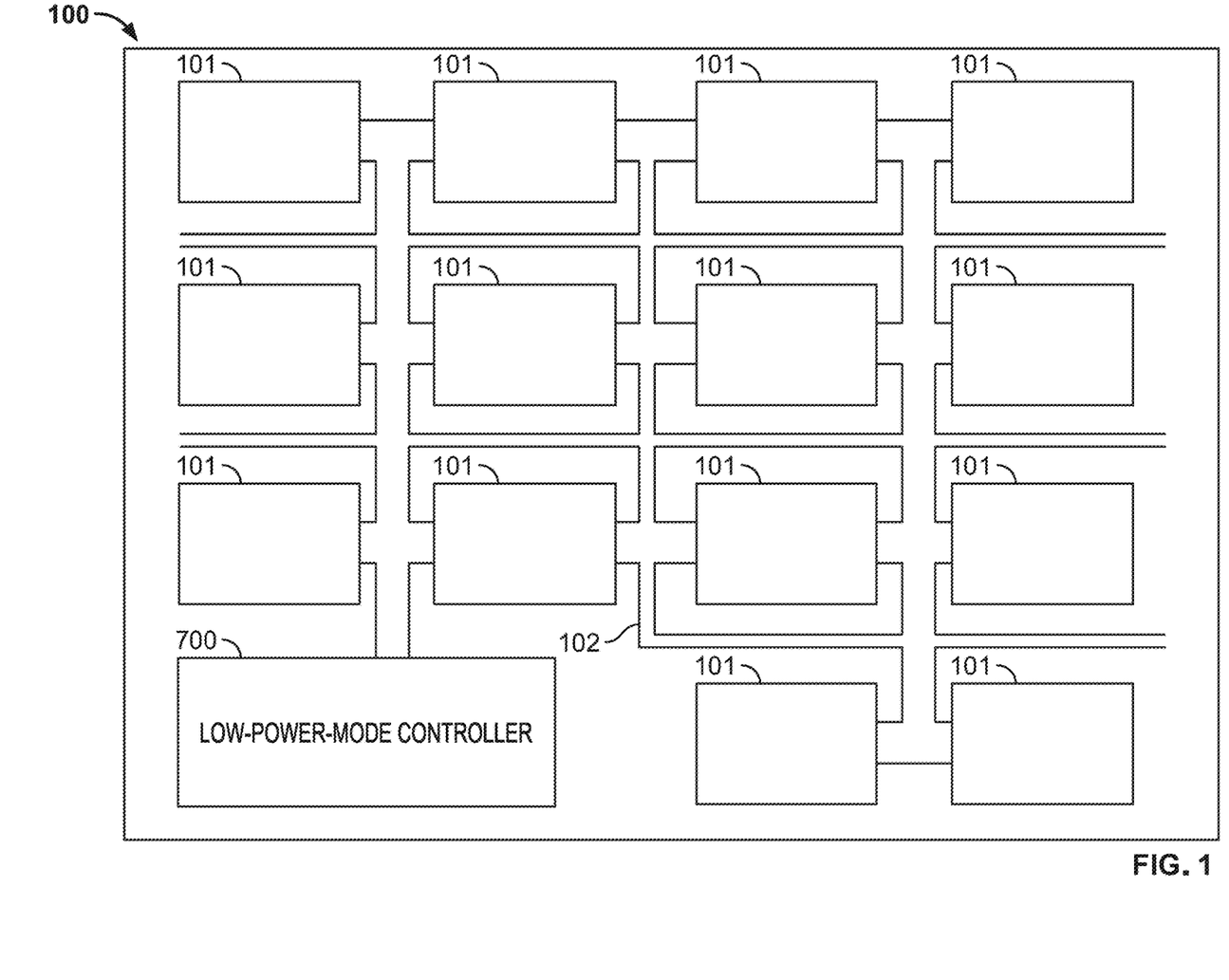
FIG. 1 is a high-level conceptual diagram of an integrated circuit device with which the subject matter of this disclosure may be used.

FIG. 1 is a high-level conceptual diagram of an integrated circuit device 100 with which the subject matter of this disclosure may be used. Integrated circuit device 100 may include a plurality of cells or modules 101, interconnected by conductive paths 102. Integrated circuit device 100 may be an unitary device, in which all cells or modules 101 are located on a single integrated circuit die, or may be a system-on-chip in which different groups of cells or modules 101 are located on different dice, which may be mounted on a single semiconductor substrate or may be mounted on different semiconductor substrates located on a single printed circuit board (not shown).

The various different cells or modules 101 may have different levels of leakage power consumption even when gated off in clock gating mode. That is, even though signals are not propagating, there may be some degree of leakage power consumption in each cell or module 101 even when the respective cell or module 101 is gated off. For any individual cell or module 101 the level of leakage power consumption may be different for different combinations of input signals, even though those signals do not propagate through the cell or module 101. And the range of possible leakage power consumption may vary from one cell or module 101 to another cell or module 101.

Specifically, a first cell or module 101 may have a first range of possible levels of leakage power consumption, while a second cell or module 101 may have a second range of possible levels of leakage power consumption that is different from the first range. Indeed, it is possible that the lowest possible level of leakage power consumption of the first cell or module 101 may be higher than the highest possible level of leakage power consumption of the second cell or module 101. However, most of the ranges of leakage power consumption would be expected to overlap.

The particulars of cells or modules 101 and interconnect structure 102 will differ depending on the particulars of a specific instance of integrated device 100. However, implementations of integrated circuit device 100 will include a low-power-mode controller 700 that interfaces, in the manner shown in FIG. 7, with the scan chain circuitry typically provided on integrated circuit devices.

Figure 2:
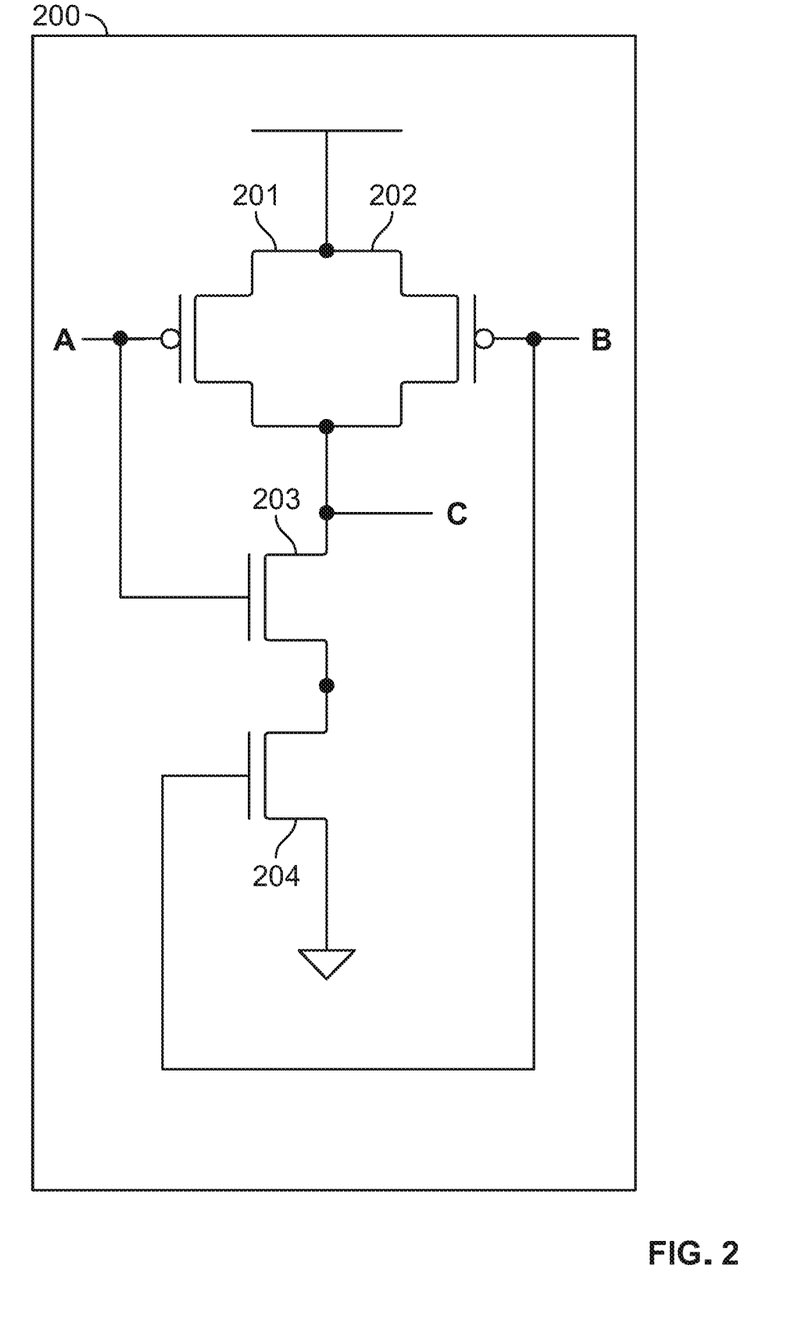
FIG. 2 shows the structure of a CMOS implementation of a NAND-gate as an example of a cell or module whose leakage power may be controlled according to implementations of the subject matter of this disclosure.

FIG. 2 shows the structure 200 of a CMOS-based implementation of a NAND-gate as an example of a cell or module 101. NAND-gate 200 includes two PMOS transistors 201, 202 in parallel, in series with a series combination of two NMOS transistors 203, 204. The gates of transistors 201, 203 are coupled together as a first input A, while the gates of transistors 202, 204 are coupled together as a second input B. The output C is taken where the two parallel two PMOS transistors 201, 202 are coupled to the two series NMOS transistors 203, 204.

The leakage power consumption of NAND-gate 200 is state-dependent. That is, the leakage power consumption differs for different combinations of inputs A and B. In one example, the lowest leakage power consumption occurs when A=B=0, and the highest leakage power consumption occurs when A=B=1 and may be several times the lowest leakage power consumption.

A NAND-gate such as NAND-gate 200 is one example of a low-threshold-voltage, high-drive-strength cell with high leakage power consumption. Other examples of low-threshold-voltage, high-drive-strength cells with high leakage power consumption include AND-gates, OR-gates, NOR-gates, AND/OR/INVERT-gates (AOI-gates), and OR/AND/INVERT-gates (OAT-gates). However, there may be other types of low-threshold-voltage, high-drive-strength cells with high leakage power consumption.

Figure 3:
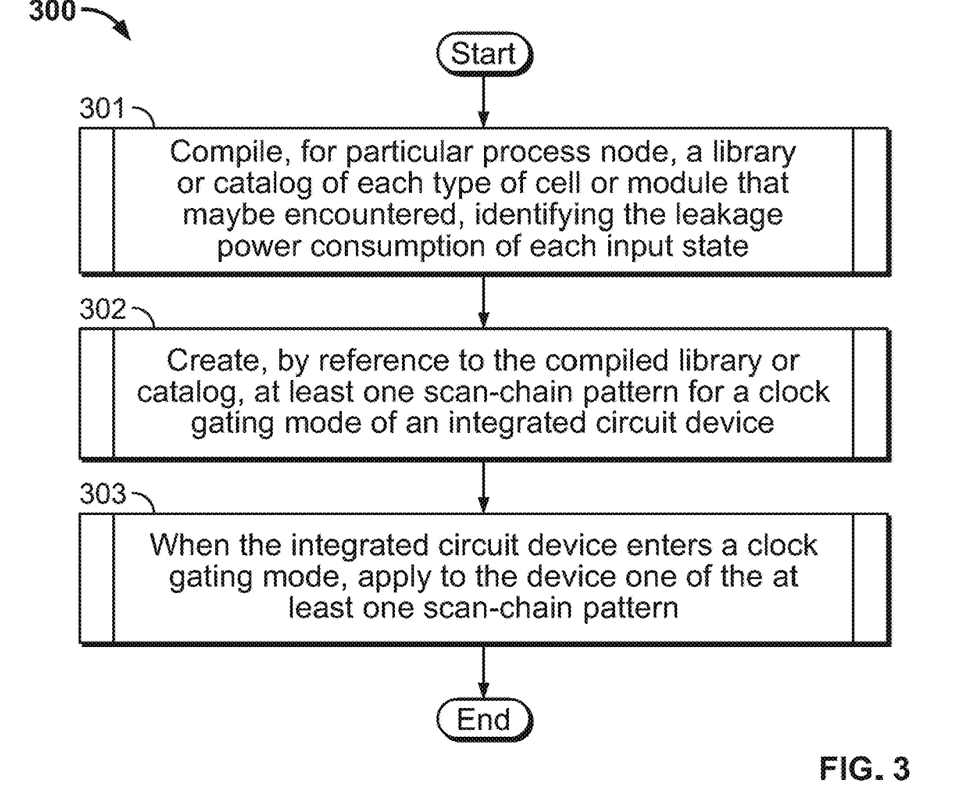
FIG. 3 is a flow diagram illustrating the general flow of a process according to implementations of the subject matter of this disclosure.

FIG. 3 shows the general flow of a process 300 according to implementations of the subject matter of this disclosure. At 301, a library or catalog may be compiled identifying the leakage power consumption of each input state for each type of cell or module that may be encountered in integrated circuit devices that are manufactured on a particular process node. Leakage power consumption may differ for the same type of cell at different process nodes, and therefore the library or catalog may have to be compiled separately for each different process node at which devices may be made. Thus, there may be separate libraries or catalogs for 10 nm devices, 7 nm devices, 5 nm devices, and 3 nm devices, as well any larger or smaller nodes developed in the past or that may be developed in the future.

Next, at 302, at least one scan-chain pattern is created for a clock gating mode of an integrated circuit device by referencing the data compiled at 301, and at 303, when that integrated circuit device enters a clock gating mode, a scan-chain pattern developed at 302 is applied to the device.

Figure 4:
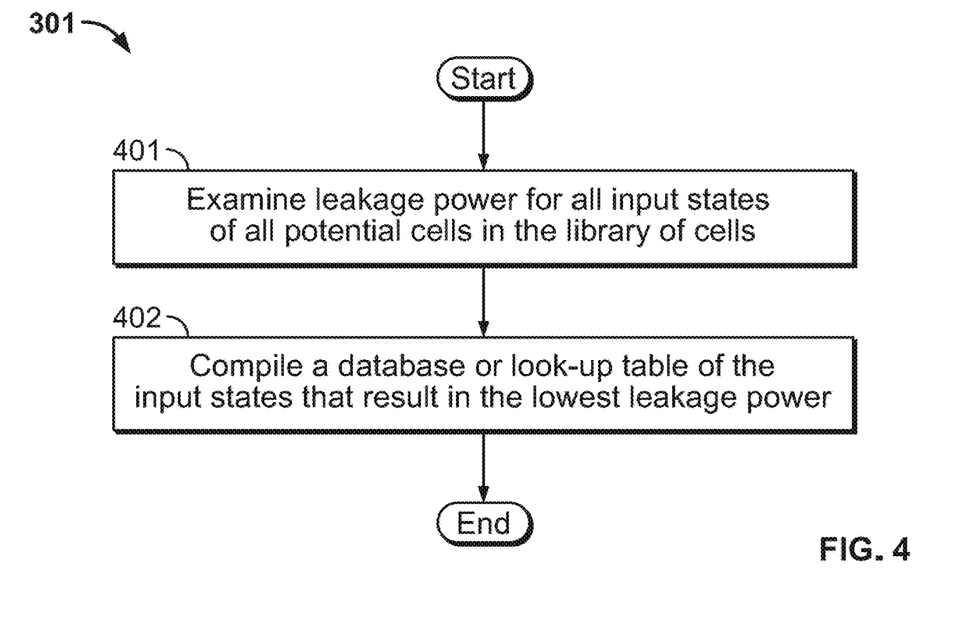
FIG. 4 is a flow diagram of a portion of the process illustrated in FIG. 3, for compiling a look-up table of input states that result in the lowest leakage power.

FIG. 4 shows an implementation of sub-process 301 of process 300. At 401, leakage power for all input states of all potential cells in the library of cells is examined, and at 402, a database or look-up table of the input states that result in the lowest leakage power is compiled. Such a look-table may appear as follows:

| Cell Type | Input State for Lowest Leakage Power |
| --- | --- |
| 2-input NAND gate | A = 0; B = 0 |
| . | . |
| . | . |
| . | . |
| . | . |
| . | . |
| . | . |
| . | . |

Figure 5:
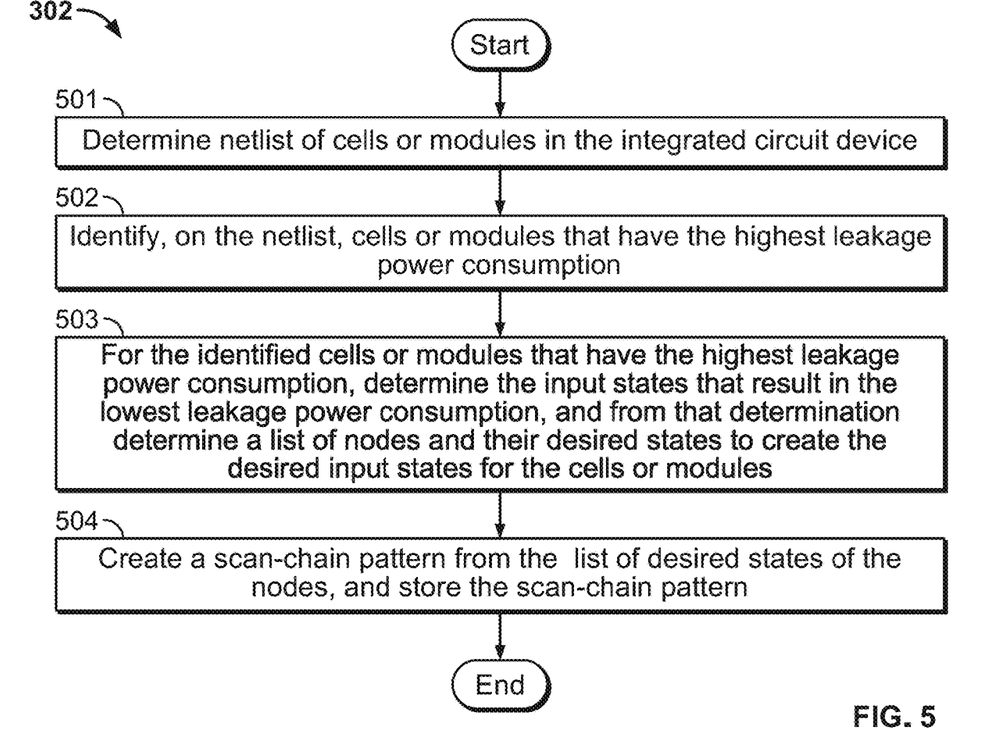
FIG. 5 is a flow diagram of a portion of the process illustrated in FIG. 3 for creating one or more scan-chain patterns for configuring the input states determined according to FIG. 4.

FIG. 5 shows an implementation of sub-process 302 of process 300. At 501, the netlist of cells or modules in the integrated circuit device is determined. At 502, those cells or modules on the netlist that have the highest leakage power consumption are identified. Typically, a small subset of cells or modules with the highest leakage power consumption can consume more than half the leakage power of the device. For example, in one implementation, the cells or modules that rank in the top 10% of leakage power consumption are identified, because that may account for 60% to 70% of total leakage power consumption. At 503, based on the database or look-up table, compiled at 402, of the input states that result in the lowest leakage power consumption, the input states that place the cells or modules identified at 502 into their lowest leakage power states are determined, and from that determination a list of nodes and their desired states—to create the desired input states for the cells or modules identified at 502—is compiled. At 504, from the list compiled at 503, a scan-chain pattern is created and stored.

As discussed above, a single scan-chain pattern may be created at 504, and that pattern may be used at run-time for the clock gating mode. Alternatively, multiple possible low-power scenarios may be used to select different groups of cell or modules that are likely to be placed into clock gating mode in different scenarios, and a corresponding scan-chain pattern may be created at 504 for each of those scenarios and stored.

Figure 6:
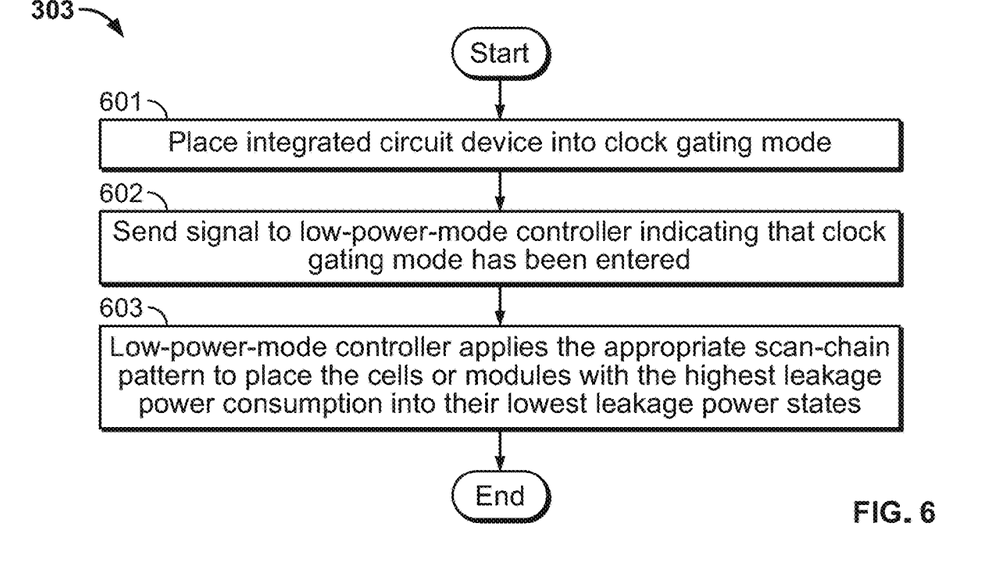
FIG. 6 is a flow diagram of a portion of the process illustrated in FIG. 3 for applying one of the scan-chain patterns created according to FIG. 5.

FIG. 6 shows an implementation of sub-process 303 of process 300, which occurs at run-time. At 601, the integrated circuit device is placed into clock gating mode. At 602, a signal is sent to a low-power-mode controller (see below) indicating that clock gating mode has been entered. At 603, the low-power-mode controller applies the appropriate scan-chain pattern to place the cells or modules with the highest maximum leakage power consumption into their respective lowest leakage power states among all of its possible leakage power states. If, as discussed above, only one scan-chain pattern was created at 504, then that scan-chain pattern is applied at 603. Alternatively, if, as also discussed above, scan-chain patterns were created at 504 for different low-power scenarios, then the appropriate pattern is applied at 603.

Figure 7:
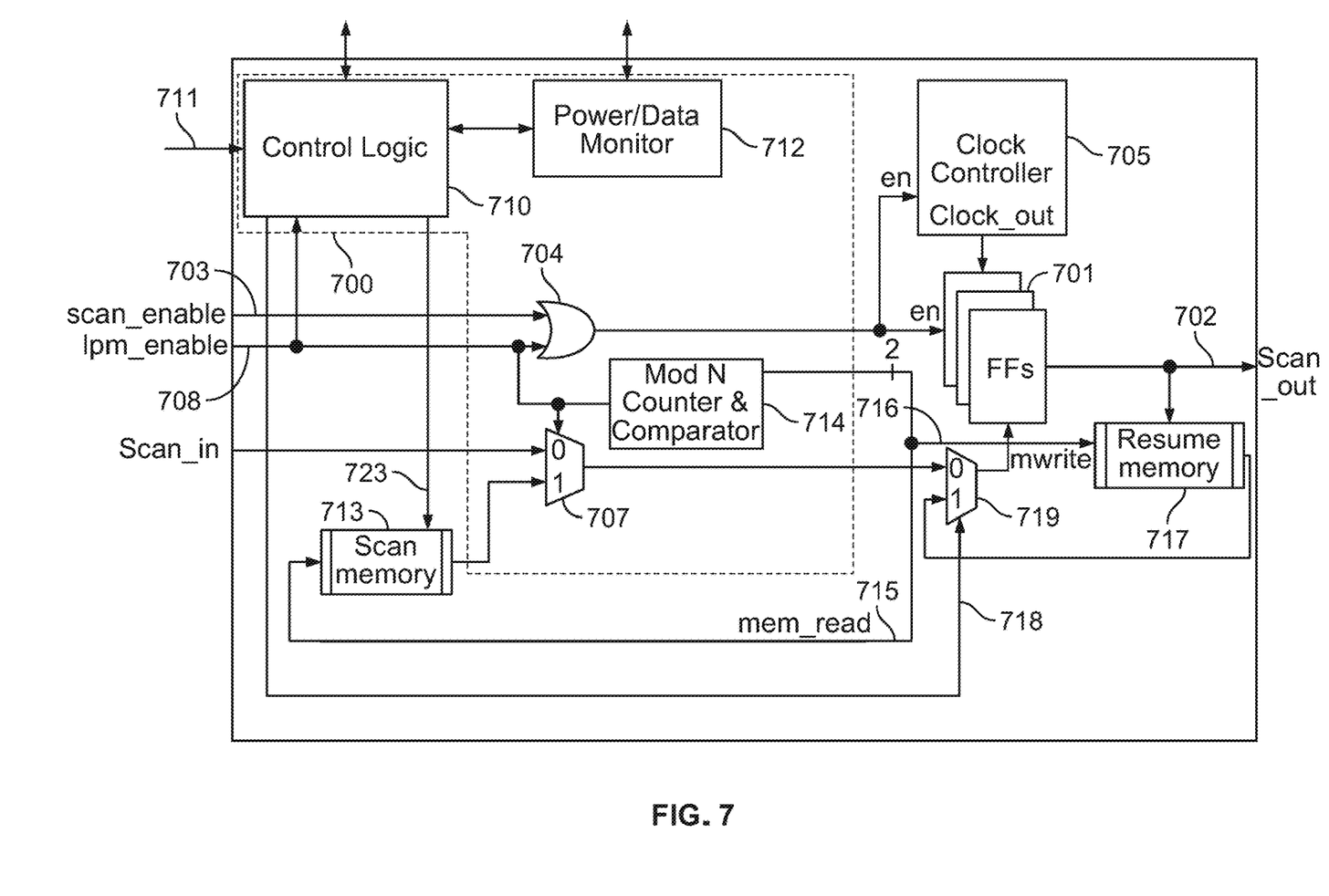
FIG. 7 is a schematic representation of control circuitry provided according to implementations of the subject matter of this disclosure in the integrated circuit device of FIG. 1.

As shown in FIG. 7, in accordance with implementations of the subject matter of this disclosure, low-power-mode controller 700 interfaces with scan-chain circuitry including scan-chain elements 701, which may be, for example, D-type flip-flops, which output to the remainder of integrated circuit device 100 via scan-chain path 702. Typical scan-chain operation is enabled by scan-enable signal 703, which, via OR-gate 704, enables clock controller 705 which clocks flip-flops 701. The data for typical scan-chain operation is input at Scan in input 706, selected by multiplexer 707 when low-power-mode-enable (lpm_enable) signal 708 is not asserted.

In accordance with implementations of the subject matter of this disclosure, low-power-mode controller 700 includes control logic 710, which determines when integrated circuit device 100 is to enter the clock gating mode, either based on external input (from a user or from another device) at 711, or based on monitoring, at 712, power usage and/or data throughput at cells or modules 101 throughout integrated circuit device 100.

When control logic 710 determines that integrated circuit device 100 should enter the clock gating mode, it asserts lpm_enable signal 708, enabling clock controller 705, which typically is no longer enabled at this stage of operation. Assertion of lpm_enable signal 708 also switches the inputs of scan-chain flip-flops 701 from Scan_in input 706 to scan memory 713, where the scan-chain pattern or patterns derived at 504 may be stored. Finally, assertion of lpm_enable signal 708 starts counter/comparator 714 which, after a delay sufficient for all low-power-mode settings to propagate and settle, issues mem_read signal 715 to tell scan memory 713 to start outputting the selected scan-chain pattern to flip-flops 701. As described above, there may be only one scan-chain pattern in scan memory 713, or there may be several different scan-chain patterns in scan memory 713 for different low-power scenarios. In the latter case, control logic 710 tells scan memory 713, at 723, which scan-chain pattern to read out.

Counter/comparator 714 also issues mwrite signal 716 that tells resume memory 717 to store the previous contents of flip-flops 701 (before they are overwritten by the scan-chain pattern from scan memory 713), for later use in a resume operation. Specifically, whatever data may have been stored in flip-flops 701 before initiation of low-power mode is written to resume memory 717. When low-power mode ends (as determined by control logic 710 based on external input at 711, or based on monitoring at 712), control logic 710 asserts resume signal 718 which causes multiplexer 719 to select the output of resume memory 717 as the input to flip-flops 701 and also causes resume memory 717 to read the stored previous contents of flip-flops 701 back to flip-flops 701.

Thus it is seen that methods and circuitry for using available scan chain resources of an integrated circuit device, to configure a low-power mode of the integrated circuit device to reduce leakage power, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of operating an integrated circuit device in a low-power mode to reduce leakage power in cells or modules of the integrated circuit device when respective ones of the cells or modules of the integrated circuit device are placed in respective low-power states, the method comprising:
creating in advance at least one scan-chain pattern to apply, to each respective cell or module in the low-power mode, a set of inputs that results in a respective low-power state with reduced leakage power, the creating including:
identifying, in advance, which respective ones of the cells or modules have highest leakage power consumption,
for each respective one of the cells or modules identified as having the highest leakage power consumption, identifying, in advance, a respective combination of inputs to place that respective one of the cells or modules in a respective low-power state to minimize leakage power consumption, and
configuring, in advance, the at least one scan-chain pattern to apply, to each respective one of the cells or modules identified as having the highest leakage power consumption, the respective combination of inputs to place that respective one of the cells or modules in a respective low-power state to minimize leakage power consumption; and
upon entry of the integrated circuit device into the low-power mode, propagating the scan-chain pattern through the integrated circuit device.

2. The method of claim 1, wherein:
creating in advance at least one scan-chain pattern comprises creating in advance a plurality of scan-chain patterns, each respective scan-chain pattern corresponding to a different respective low-power mode in which different ones of the cells or modules are placed into their respective low-power states; the method further comprising:
upon entry of the integrated circuit device into the low-power mode, prior to propagating the scan-chain pattern through the integrated circuit device, identifying which respective low-power mode has been entered and selecting one of the plurality of scan-chain patterns corresponding to the respective low-power mode.

3. The method of claim 1, further comprising:
storing the at least one scan chain in a scan-chain memory; and
on entry into the low-power mode, selecting the scan-chain memory as an input to scan-chain circuitry of the integrated circuit device.

4. The method of claim 1, further comprising:
upon entry of the integrated circuit device into the low-power mode, prior to propagating the scan-chain pattern through the integrated circuit device, saving, for later use, data previously stored in scan-chain circuitry of the integrated circuit device.

5. The method of claim 4, further comprising, upon exit from the low-power mode, restoring the saved data to the scan-chain circuitry.

6. The method of claim 5, wherein saving the data previously stored in the scan-chain circuitry of the integrated circuit device comprises writing the data previously stored in the scan-chain circuitry of the integrated circuit device into a resume memory.

7. The method of claim 6, wherein restoring the saved data to the scan-chain circuitry comprises writing the data in the resume memory into the scan-chain circuitry.

8. The method of claim 6, wherein writing the data in the resume memory into the scan-chain circuitry comprises issuing a resume signal that selects output of the resume memory as input to the scan chain circuitry.

9. The method of claim 6, wherein writing the data previously stored in the scan-chain circuitry of the integrated circuit device into the resume memory comprises, after a delay, from entry into the low-power mode, sufficient for low-power mode settings to settle, issuing a memory write signal to the resume memory.

10. An integrated circuit device, comprising:
a plurality of cells or modules, each respective one of the cells or modules consuming leakage power, the amount of leakage power consumed by a respective one of the cells or modules varying depending on states of inputs to the respective one of the cells or modules;

scan-chain circuitry configured to propagate through the integrated circuit device, on entry of the integrated circuit device to a low-power mode, a scan-chain pattern created in advance, to apply, to each respective cell or module in the low-power mode, a set of inputs that results in a respective low-power state with reduced leakage power, by:

identifying, in advance, which respective ones of the cells or modules have highest leakage power consumption;

for each respective one of the cells or modules identified as having the highest leakage power consumption, identifying, in advance, a respective combination of inputs to place that respective one of the cells or modules in a respective low-power state to minimize leakage power consumption, and configuring, in advance, the at least one scan-chain pattern to apply, to each respective one of the cells or modules identified as having the highest leakage power consumption, the respective combination of inputs to place that respective one of the cells or modules in a respective low-power state to minimize leakage power consumption.

11. The integrated circuit device of claim 10, wherein:

the scan-chain circuitry is configured to propagate through the integrated circuit device, on entry of the integrated circuit device to a low-power mode, one of a plurality of scan-chain patterns created in advance, each respective scan-chain pattern corresponding to a different respective low-power mode in which different ones of the cells or modules are placed into their respective low-power states; the scan-chain circuitry comprising a controller configured to:

upon entry of the integrated circuit device into the low-power mode, prior to propagating the scan-chain pattern through the integrated circuit device, identifying which respective low-power mode has been entered and selecting one of the plurality of scan-chain patterns corresponding to the respective low-power mode.

12. The integrated circuit device of claim 10, further comprising:

a scan-chain memory configured to store the at least one scan chain; and a controller configured to, on entry into the low-power mode, select the scan-chain memory as an input to scan-chain circuitry of the integrated circuit device.

13. The integrated circuit device of claim 10, wherein the controller is further configured to:

upon entry of the integrated circuit device into the low-power mode, prior to propagating the scan-chain pattern through the integrated circuit device, save, for later use, data previously stored in scan-chain circuitry of the integrated circuit device.

14. The integrated circuit device of claim 13, wherein the controller is further configured to, upon exit from the low-power mode, restore the saved data to the scan-chain circuitry.

15. The integrated circuit device of claim 14, further comprising:

a resume memory; wherein:

the controller is further configured to write the data previously stored in the scan-chain circuitry of the integrated circuit device into the resume memory.

16. The integrated circuit device of claim 15, wherein the controller is configured to restore the saved data to the scan-chain circuitry by writing the data in the resume memory into the scan-chain circuitry.

17. The integrated circuit device of claim 15, wherein the controller is configured to write the data in the resume memory into the scan-chain circuitry by issuing a resume signal that selects output of the resume memory as input to the scan chain circuitry.

18. The integrated circuit device of claim 15, wherein the controller is configured to write the data previously stored in the scan-chain circuitry of the integrated circuit device into the resume memory by issuing a memory write signal to the resume memory after a delay, from entry into the low-power mode, sufficient for low-power mode settings to settle.

* * * * *